United States Patent
Komiyama et al.

(10) Patent No.: US 10,181,662 B2
(45) Date of Patent: Jan. 15, 2019

(54) SWITCHING DEVICE HAVING A PUSH BUTTON

(71) Applicant: LENOVO (SINGAPORE) PTE. LTD., Singapore (SG)

(72) Inventors: Hirohide Komiyama, Kanagawa (JP); Yoshio Nakamura, Kanagawa (JP); Seiji Yamasaki, Kanagawa (JP); Osamu Yamamoto, Kanagawa (JP); Takaaki Okada, Kanagawa (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 15/991,948

(22) Filed: May 29, 2018

(65) Prior Publication Data
US 2018/0342821 A1    Nov. 29, 2018

(30) Foreign Application Priority Data
May 26, 2017   (JP) .................... 2017-104395

(51) Int. Cl.
| | |
|---|---|
| *H01R 12/61* | (2011.01) |
| *H01R 12/57* | (2011.01) |
| *H01R 12/62* | (2011.01) |
| *H05K 3/34* | (2006.01) |
| *H01R 12/53* | (2011.01) |
| *H05K 3/36* | (2006.01) |
| *H05K 1/11* | (2006.01) |

(52) U.S. Cl.
CPC ............ *H01R 12/61* (2013.01); *H01R 12/53* (2013.01); *H01R 12/57* (2013.01); *H01R 12/62* (2013.01); *H05K 3/3478* (2013.01); *H05K 3/361* (2013.01); *H05K 1/111* (2013.01)

(58) Field of Classification Search
CPC ...... H05K 3/361; H05K 3/3478; H01R 12/53; H01R 12/61; H01R 12/62
USPC ......................................... 174/250
See application file for complete search history.

(56) References Cited

U.S. PATENT DOCUMENTS

| | | | |
|---|---|---|---|
| 2009/0173533 | A1 | 7/2009 | Brock et al. |
| 2017/0064828 | A1* | 3/2017 | Ohtsu ............ H05K 1/144 |
| 2017/0064829 | A1* | 3/2017 | Ohtsu ............ H05K 1/144 |

FOREIGN PATENT DOCUMENTS

| | | |
|---|---|---|
| JP | S60-170176 | 9/1985 |
| JP | 02-103808 A | 4/1990 |

(Continued)

*Primary Examiner* — Sherman Ng
(74) *Attorney, Agent, or Firm* — Antony P. Ng; Russell Ng PLLC (57) ABSTRACT

A cable connection method is provided. In a cable connection structure, a connection agent in which fine solder particle are densely scattered in a thermosetting resin-based adhesive is interposed between a connection portion of a flexible printed cable (FPC) cable in which a shield layer is formed on one surface side of a signal layer and a connection portion on a substrate side. Then, the connection portion of the FPC cable and the connection portion on the substrate side are solder connected by heating. A shield layer corresponding to the connection portion of the FPC cable and/or a region portion up to a position separated from the base end side of the connection portion of the FPC cable by a predetermined length is configured with a conductive mesh structure body. The other region of the shield layer contains a conductive flat plate structure.

14 Claims, 7 Drawing Sheets

(56) References Cited

FOREIGN PATENT DOCUMENTS

| JP | 02-181305 A | 7/1990 |
| JP | 04-287397 A | 10/1992 |
| JP | 05-144521 A | 6/1993 |
| JP | 08-162559 A | 6/1996 |
| JP | 08-255994 A | 10/1996 |
| JP | 09-181400 A | 7/1997 |
| JP | 10-112224 A | 4/1998 |
| JP | 2001-502127 A | 2/2001 |
| JP | 2002-216873 A | 8/2002 |
| JP | 2007-149815 A | 6/2007 |
| JP | 2016-207842 A | 12/2016 |

* cited by examiner

SWITCHING DEVICE HAVING A PUSH BUTTON

PRIORITY CLAIM

The present application claims benefit of priority under 35 U.S.C. §§ 120, 365 to the previously filed Japanese Patent Application No. JP2017-104395 with a priority date of May 26, 2017, which is incorporated by reference herein.

TECHNICAL FIELD

The present invention relates to cable connectors in general, and in particular to a cable connection structure for ensuring the bonding of a flexible printed circuit (FPC) cable to a substrate.

BACKGROUND

For the connection between a FPC and a rigid printed circuit (RPC), a connector and an anisotropic conductive film (ACF) have been used. When the FPC cable is connected to the substrate, it is common to dispose a connector for exclusive use on the substrate, and then connect the FPC cable to the connector. When the FPC cable is connected to the substrate using the connector, a cable terminal portion is covered with a shield layer of the FPC cable and each signal line can be shielded by the connector. Thus, electromagnetic waves leaking from the connection between the FPC cable and the substrate can be eliminated.

In order to reduce the thickness of electronic devices, a FPC cable is sometimes directly bonded to a substrate. For direct bonding, an ACF and solder-in-glue (SIG) are utilized. In SIG bonding, when heat is applied to a connection agent in which fine solder particles are scattered in a thermosetting resin-based adhesive, the fine solder particles melt for solder bonding and the adhesive is cured for electrical and physical bonding. At this time, the fine solder particles are scattered, and therefore an electrical short-circuit does not occur between adjacent different signal terminals.

When an FPC cable in which a shield layer is formed on at least one surface side of a signal layer in which a signal line group is arranged is directly bonded to a substrate, the adhesive described above is interposed between the FPC cable and the substrate, and then a hot bar is pressed against the substrate side from the shield layer side of the FPC cable to melt the solder. The shield layer has high thermal conductivity, and the heat supplied from the hot bar escapes through the shield layer, so that solder connection cannot be ensured, and the shield layer of the connection portion is removed. However, when the shield layer is removed, the shield layer does not present in a connection portion where the shield layer is removed and the solder connection is performed, and electromagnetic waves leak from the connection portion.

Consequently, it would be preferable to provide an improved cable connection structure capable of ensuring the bonding of an FPC cable to a substrate.

SUMMARY

In accordance with an embodiment of the present disclosure, in a cable connection structure, a connection agent in which fine solder particle are densely scattered in a thermosetting resin-based adhesive is interposed between a connection portion of a FPC cable in which a shield layer is formed on one surface side of a signal layer and a connection portion on a substrate side. Then, the connection portion of the FPC cable and the connection portion on the substrate side are solder connected by heating. A shield layer corresponding to the connection portion of the FPC cable and/or a region portion up to a position separated from the base end side of the connection portion of the FPC cable by a predetermined length is configured with a conductive mesh structure body. The other region of the shield layer contains a conductive flat plate structure.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

I. First Embodiment

Figure 1:
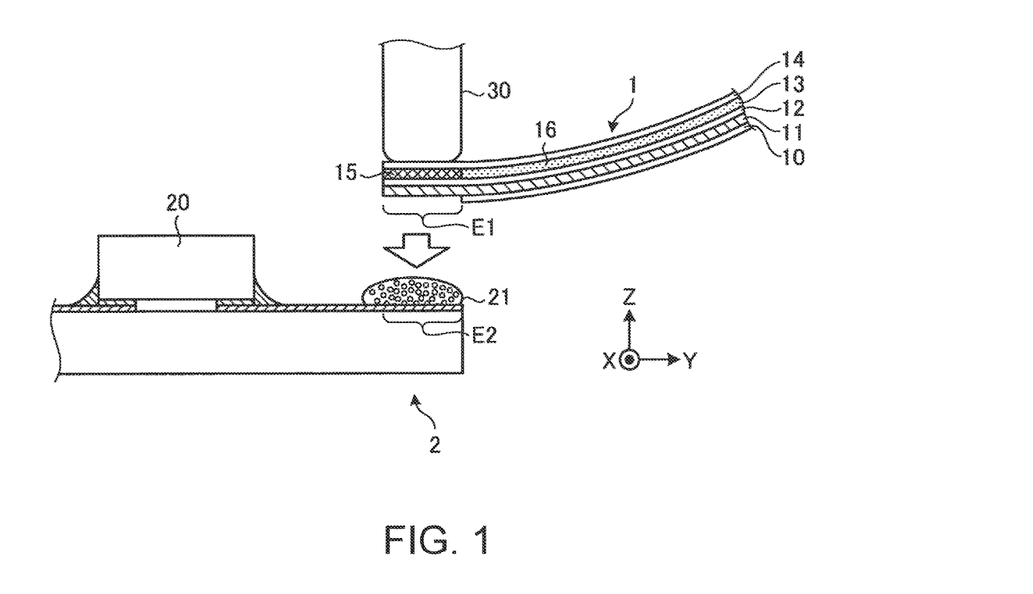
FIG. 1 illustrates a state of bonding a FPC cable to a substrate, according to a first embodiment.
Figure 2:
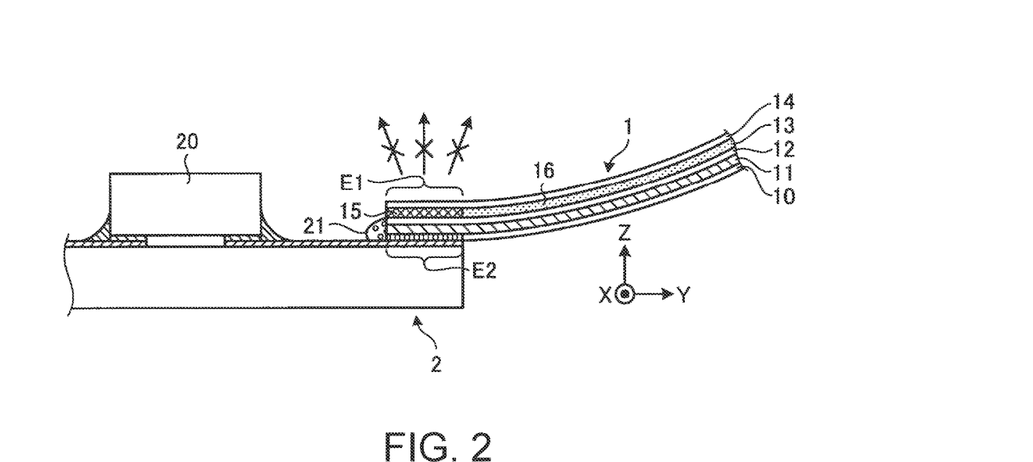
FIG. 2 is a cross-sectional view illustrating the cable connection structure in which the FPC cable is bonded to the substrate.
Figure 3:
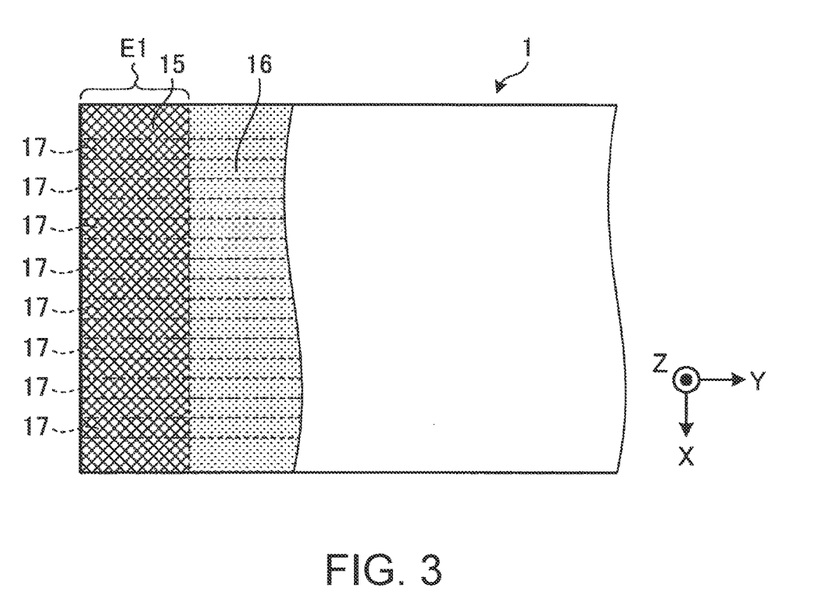
FIG. 3 is a top view of the FPC cable from in FIG. 1.

FIG. 1 illustrates a state of bonding an FPC cable 1 to a substrate 2 according to a first embodiment. FIG. 2 is a cross-sectional view of the cable connection structure in which the FPC cable 1 is bonded to the substrate 2. FIG. 3 is a top view of the FPC cable 1.

As illustrated in FIGS. 1 and 3, an insulating layer 10, a signal layer 11, an insulating layer 12, a shield layer 13, and an insulating layer 14 are sequentially laminated in the FPC cable 1. FIG. 3 illustrates a connection portion E1 side of the insulating layer 14 which is partially cutaway. The insulating layer 10 in the connection portion E1 on the tip side of the FPC cable 1 is removed, so that the signal layer 11 is exposed. The connection portion E1 of the shield layer 13 contains a conductive mesh structure body 15. On the other hand, a portion other than the connection portion E1 of the shield layer 13 contains a conductive flat plate structure 16. As illustrated in FIG. 3, the signal layer 11 has a signal line group in which a plurality of signal lines 17 is arranged. The signal lines 17 may include a ground line. The mesh hole diameter of the conductive mesh structure body 15 is less than the wavelength of signals flowing through the signal lines 17.

On the other hand, an electronic component 20 is disposed and signal lines, which are not illustrated, to which the signal lines 17 are connected are exposed in a connection portion E2 to which the FPC cable 1 is connected on the substrate 2. The signal lines which are not illustrated are arranged at the same interval as the interval of the signal lines 17. On the connection portion E2, a connection agent 21 in which fine solder particles are densely scattered in a thermosetting resin-based adhesive, such as resin, is applied in order to perform SIG bonding. Then, as illustrated in FIG. 1, a hot bar 30 is pressed against the connection portion E1 of the FPC cable 1 from the conductive mesh structure body 15 side, and then the connection portion E1 is pressed under heating against the connection portion E2 of the substrate 2 through the connection agent 21. Thus, the fine solder particles in the connection agent 21 of the portion where the signal lines 17 are present melt, so that the FPC cable 1 and the substrate 2 are electrically connected to each other as illustrated in FIG. 2.

The connection portion E1 of the shield layer 13 is the conductive mesh structure body 15, and therefore prevents the escape of the heat of the hot bar 30 to the conductive flat plate structure 16 side, and thus efficiently transmits the heat to the signal layer of the connection portion E1. Moreover, as illustrated in FIG. 2, the conductive mesh structure body 15 shields the connection portions E1 and E2, and therefore can prevent the leakage of electromagnetic waves in the Z direction.

Figure 4:
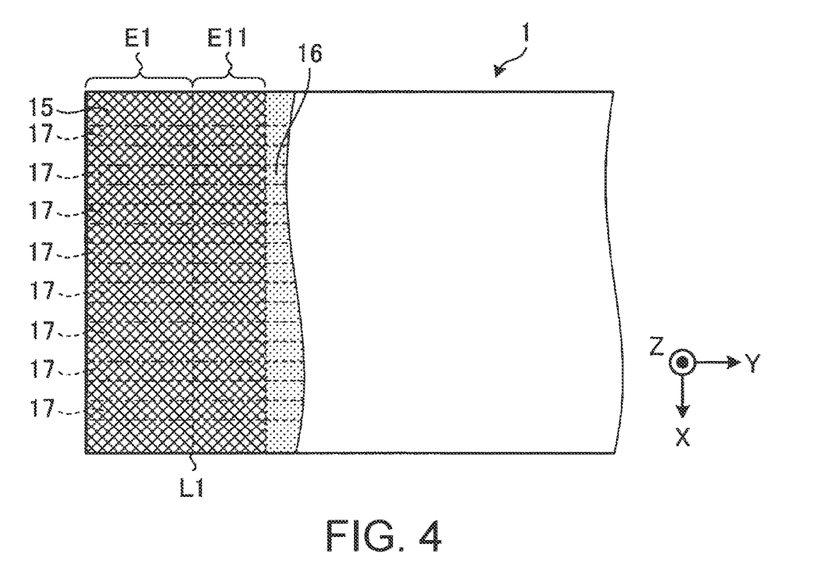
FIG. 4 is a top view of a FPC cable, according to a modification of a first embodiment.

As illustrated in FIG. 4, the conductive mesh structure body 15 may be structured so as to exceed a boundary line L1 between the connection portion E1 and a region E11 on the base end side to further extend to the region E11 on the base end side. Also in this case, the conductive mesh structure body 15 makes it difficult for the heat of the hot bar 30 to escape to the conductive flat plate structure 16 side while shielding the connection portions E1 and E2.

Figure 5:
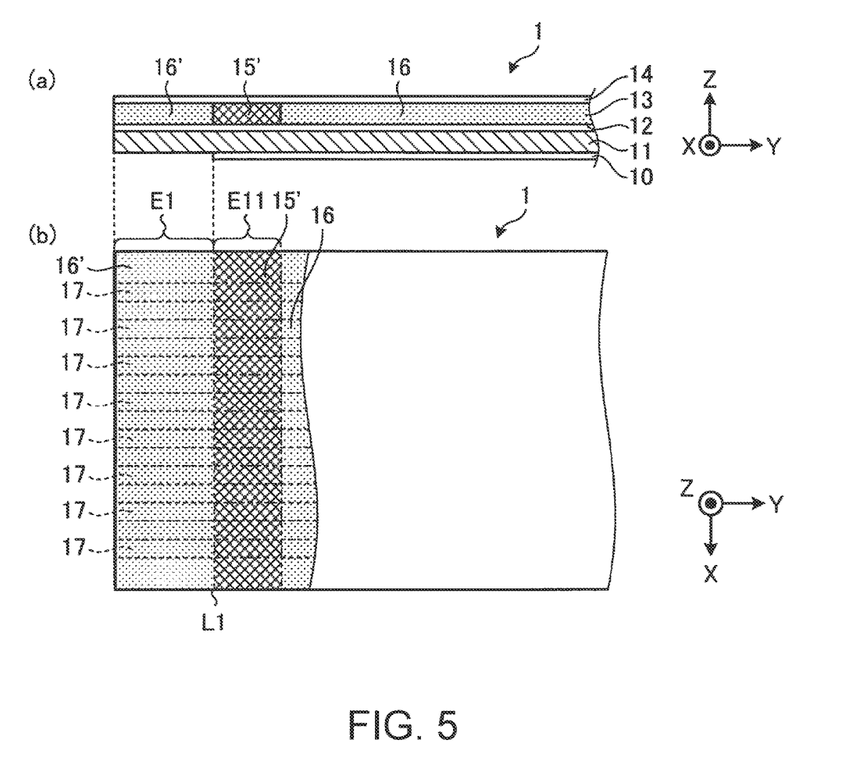
FIGS. 5A-5B illustrate another example of the FPC cable, according to a modification of a first embodiment.

As illustrated in FIG. 5, as the structure of making it difficult for the heat of the hot bar 30 to escape to the conductive flat plate structure 16 side (Y direction side), only the portion of the region E11 described above may be configured with a conductive mesh structure body 15'. In this case, the shield layer 13 of the connection portion E1 is configured with a conductive flat plate structure 16'. The conductive flat plate structure 16' efficiently transmits the heat of the hot bar 30 to the signal line 17 side and makes it difficult for the heat of the hot bar 30 to escape to the conductive flat plate structure 16 side due to the presence of the conductive mesh structure body 15'. The conductive mesh structure body 15' may be separated without contacting the boundary line L1.

II. Second Embodiment

Figure 6:
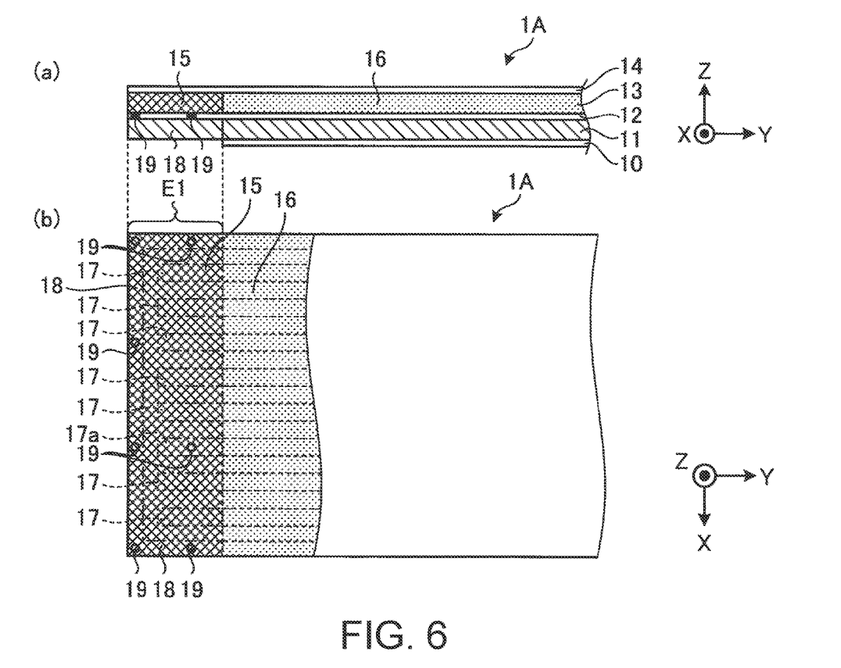
FIGS. 6A-6B illustrate the structure of an FPC cable, according to a second embodiment.

FIGS. 6A-6B are views illustrating the structure of an FPC cable 1A according to a second embodiment. FIG. 6A is a cross-sectional view of the FPC cable 1A. FIG. 6B is a top view of the FPC cable 1A which is partially cutaway. The FPC cable 1A of the second embodiment is provided with a shield guard 18 formed into a shape of surrounding the signal lines 17 on the XY plane in an edge portion of the connection portion E1 of the signal layer 11. Via halls 19 are formed in the insulating layer 12 between the conductive mesh structure body 15 and the shield guard 18 to via bond the conductive mesh structure body 15 and the shield guard 18. In FIG. 6B, a ground line 17a is present in the signal layer 11 besides the signal lines 17. The ground line 17a is connected to the shield guard 18 and is via bonded to the conductive mesh structure body 15. The interval of the via bonding is preferably less than the wavelength of signals flowing through the signal lines 17.

Figure 7:
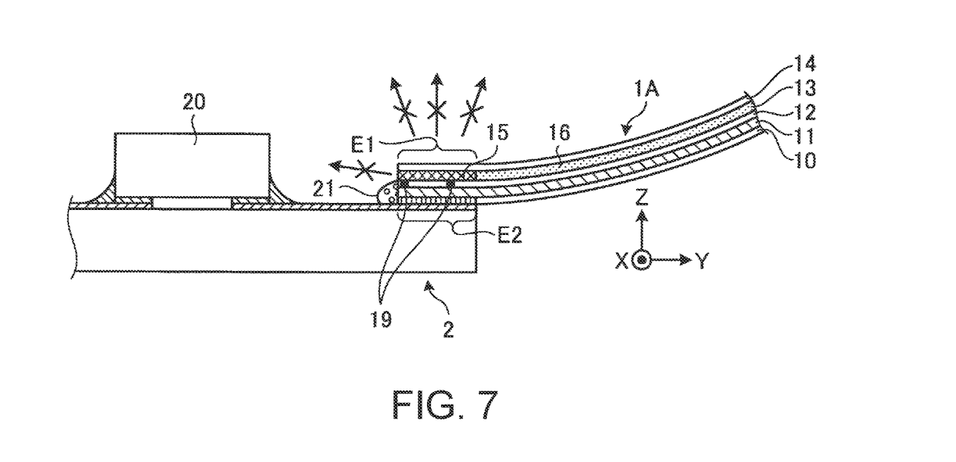
FIG. 7 is a cross-sectional view of the cable connection structure of the FPC cable and a substrate illustrated in FIG. 6.

FIG. 7 is a cross-sectional view illustrating the cable connection structure between the FPC cable 1A and the substrate 2. As illustrated in FIG. 7, the leakage of electromagnetic waves in the −Y direction from the signal layer 11 can be prevented by the shield guard 18 in addition to the prevention of the leakage of electromagnetic waves in the Z direction as with Embodiment 1 in the connection portions E1 and E2 in this embodiment 2. Moreover, the via bonding can prevent the leakage of electromagnetic waves in the −Y direction from the insulating layer 12.

III. Third Embodiment

Figure 9:
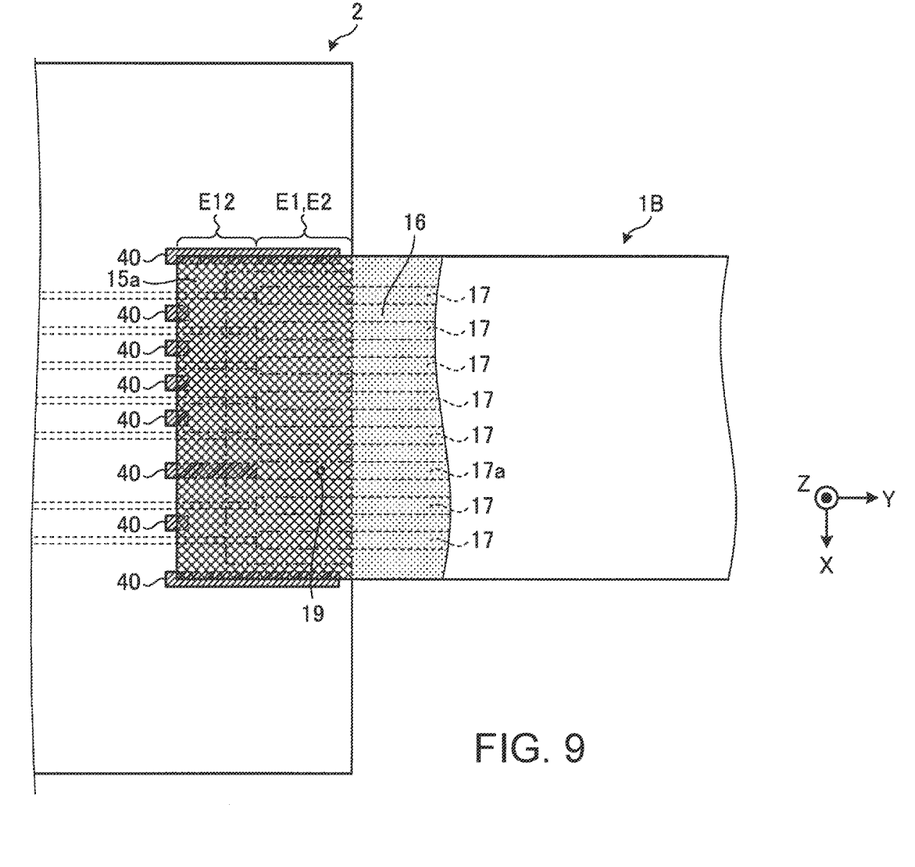
FIG. 9 is a top view of the state where the FPC cable from FIG. 8 is bonded to a substrate.
Figure 10:
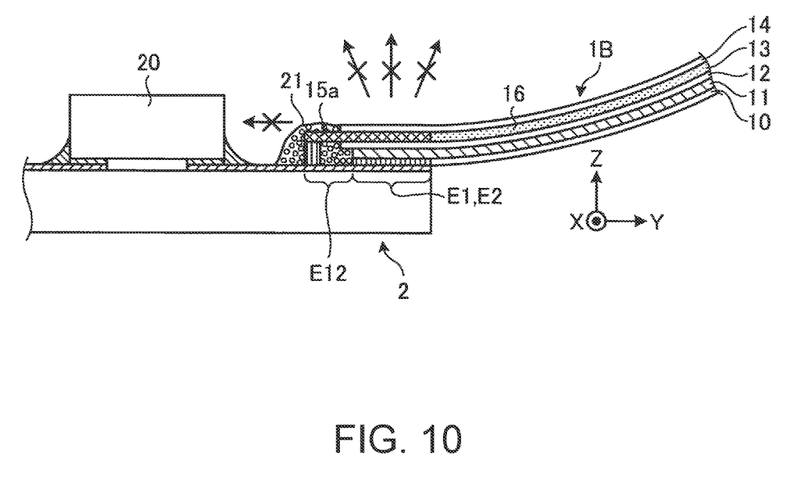
FIG. 10 is a cross-sectional view of the state where the FPC cable from FIG. 8 is bonded to the substrate from FIG. 9.

FIGS. 8A-8B illustrate the structure of an FPC cable 1B according to a third embodiment. FIG. 8A is a cross-sectional view of the FPC cable 1B. FIG. 8B is a top view of the FPC cable 1B which is partially cutaway. FIG. 9 is a top view illustrating the state where the FPC cable 1B is bonded to a substrate 2. FIG. 10 is a cross-sectional view of the state where the FPC cable 1B is bonded to the substrate 2.

Figure 8:
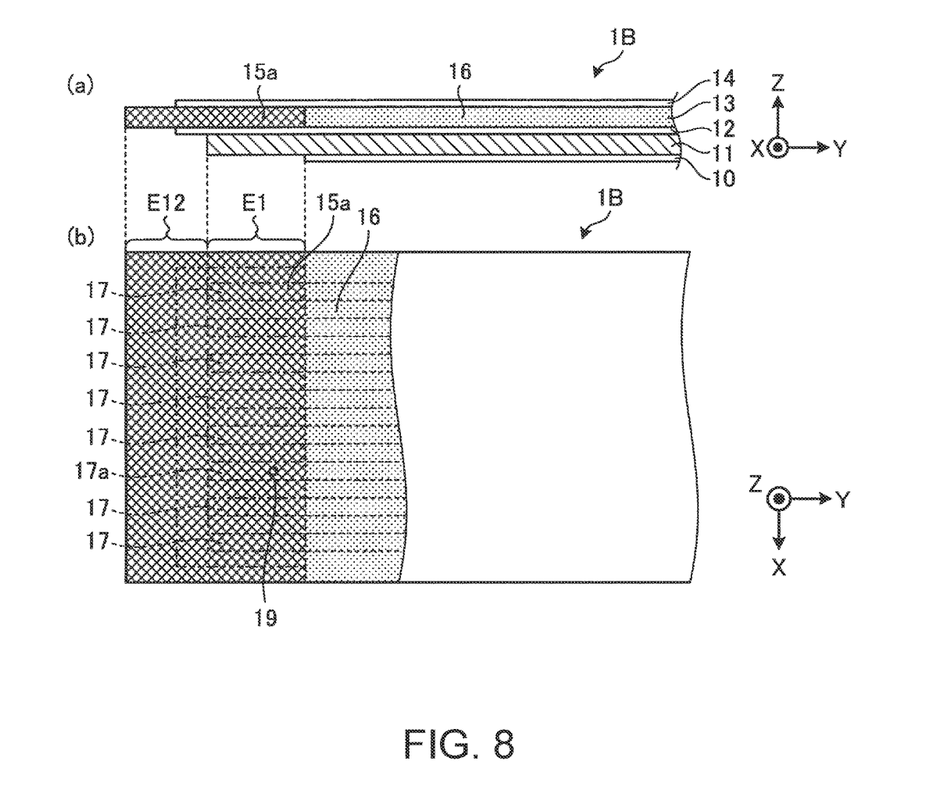
FIGS. 8A-8B illustrate the structure of an FPC cable, according to a third embodiment.

As illustrated in FIG. 8, the FPC cable 1B of this embodiment 3 is provided with a conductive mesh structure body 15a formed up to a region E12 in which a tip portion of the conductive mesh structure body 15 is further extended toward the tip (−Y direction). A via hall 19 is formed in the insulating layer 12 between the ground line 17a and the conductive mesh structure body 15.

On the other hand, exposed regions 40 in which the ground is exposed are formed in an edge portion of a region including the connection portion E1 and the region E12 on the substrate 2 except a region where signal lines are disposed on the substrate 2 side as illustrated in FIG. 9. The connection agent 21 on the substrate 2 is applied to a portion corresponding to the region including the connection portion E1 and the region E12.

An edge portion of the conductive mesh structure body 15a and the exposed regions 40 are SIG bonded to each other. The ground line 17a and the conductive mesh structure body 15a are via bonded to each other. Thus, the leakage of electromagnetic waves to the upper side (Y direction) and to the side (−Y direction) of the connection portions E1 and E2 can be certainly prevented. In particular, a region in the lateral direction from between the signal lines 17 is covered with the conductive mesh structure body 15a, so that the leakage of electromagnetic waves in the lateral direction from between the signal lines 17 can be further prevented as compared with Embodiment 2.

As has been described, the present invention provides an improved cable connection structure for ensuring the bonding of a FPC cable to a substrate.

While the invention has been particularly shown and described with reference to a preferred embodiment, it will be understood by those skilled in the art that various changes in form and detail may be made therein without departing from the spirit and scope of the invention.

What is claimed is:

1. A cable connection structure comprising:
   a substrate; and
   an flexible printed circuit (FPC) cable connected to said substrate, wherein said FPC cable includes a shield layer formed on at least one surface side of a signal layer in which a signal line group is arranged, wherein a cable side connection portion of said FPC cable and a substrate side connection portion to which said FPC cable is connected is solder connected by heating a thermosetting resin-based adhesive in which fine solder particles are densely scattered, and said cable side connection portion or a region portion up to a position separated from a base end side of said cable side connection portion by a predetermined length in said shield layer is a mesh structure.

2. The cable connection structure of claim 1, wherein a shield guard is provided in an edge portion of said cable side connection portion of said signal layer, and said shield guard and an edge portion of said shield layer of said cable side connection portion are via bonded to each other.

3. The cable connection structure of claim 2, wherein said shield layer of said cable side connection portion is via bonded to a ground line in said signal layer.

4. The cable connection structure of claim 3, wherein an interval of said via bonding is shorter than a wavelength of a signal transmitting in said signal line group.

5. The cable connection structure of claim 1, wherein said shield layer of said cable side connection portion has an extension region which is exposed to a tip side of said FPC cable and extends an exposed region in which a ground is exposed is formed in an edge portion of said substrate side connection portion corresponding to said extension region.

6. The cable connection structure of claim 5, wherein said extension region and said exposed region are solder connected to each other.

7. The cable connection structure of claim 5, wherein said shield layer of said cable side connection portion is via bonded to a ground line in said signal layer.

8. A method comprising:
interposing a connection agent in which fine solder particle are densely scattered in a thermosetting resin-based adhesive between a cable side connection portion of a flexible printed cable (FPC) cable in which a shield layer is formed on at least one surface side of a signal layer in which a signal line group is arranged and a substrate side connection portion to which said FPC cable is connected and arranging said shield layer corresponding to said cable side connection portion or a region portion up to a position separated from a base end side of said cable side connection portion by a predetermined length with a mesh structure;

pressing a hot bar from said shield layer side of said cable side connection portion; and connecting said cable side connection portion to said substrate side connection portion by soldering.

9. The method of claim 8, wherein said method further includes
providing a shield guard in an edge portion of said cable side connection portion of said signal layer; and
via bonding said shield guard and an edge portion of said shield layer of said cable side connection portion to each other.

10. The method of claim 9, wherein said method further includes via bonding said shield layer of said cable side connection portion to a ground line in said signal layer.

11. The method of claim 10, wherein an interval of said via bonding is shorter than a wavelength of a signal transmitting in said signal line group.

12. The method of claim 8, wherein said shield layer of said cable side connection portion has an extension region that is exposed to a tip side of said FPC cable and extends a substrate having said substrate side connection portion has an exposed region in which a ground of said substrate is exposed in an edge portion of said substrate side connection portion corresponding to said extension region.

13. The method of claim 12, wherein said extension region and said exposed region are solder connected to each other.

14. The method of claim 12, wherein said method further includes via bonding the shield layer of the cable side connection portion to a ground line in the signal layer.

* * * * *